(12) United States Patent
Kato

(10) Patent No.: US 7,644,387 B2
(45) Date of Patent: Jan. 5, 2010

(54) SEMICONDUCTOR MASK CORRECTING DEVICE AND SEMICONDUCTOR MASK CORRECTING METHOD

(75) Inventor: Kokoro Kato, Chiba (JP)

(73) Assignee: SII Nano Technology Inc., Chiba (JP)

( * ) Notice: Subject to any disclaimer, the term of this patent is extended or adjusted under 35 U.S.C. 154(b) by 460 days.

(21) Appl. No.: 11/796,997

(22) Filed: Apr. 27, 2007

(65) Prior Publication Data

US 2007/0262272 A1 Nov. 15, 2007

(30) Foreign Application Priority Data

May 2, 2006 (JP) ............................. 2006-128199

(51) Int. Cl.
*G06F 17/50* (2006.01)
*G06F 19/00* (2006.01)
*G03F 1/00* (2006.01)
*G21K 5/00* (2006.01)

(52) U.S. Cl. ............................. 716/19; 716/20; 716/21; 430/4; 430/5; 378/34; 378/35; 700/119; 700/120; 700/121

(58) Field of Classification Search ............. 716/19–21; 430/4–5; 378/34–35; 700/119–121
See application file for complete search history.

(56) References Cited

U.S. PATENT DOCUMENTS

| | | | | |
|---|---|---|---|---|
| 6,120,953 A | * | 9/2000 | Lin | ............................. 430/30 |
| 6,750,000 B2 | * | 6/2004 | Tanaka et al. | ............... 430/394 |
| 7,438,998 B2 | * | 10/2008 | Hiroshima | ...................... 430/5 |
| 7,519,943 B2 | * | 4/2009 | Futatsuya | ...................... 716/21 |
| 7,564,545 B2 | * | 7/2009 | Stokowski | ............... 356/237.5 |
| 2005/0169513 A1 | * | 8/2005 | Yoshikawa et al. | .......... 382/149 |

OTHER PUBLICATIONS

Benjamin G. Eynon, Jr.: "Photomask Fabrication Technology", McGraw-Hill Electronic Engineering, Chapter 7: Resolution Enhancement Techniques, p. 456-467, 2005.

* cited by examiner

*Primary Examiner*—Jack Chiang
*Assistant Examiner*—Brandon W Bowers
(74) *Attorney, Agent, or Firm*—Brinks Hofer Gilson & Lione

(57) ABSTRACT

A semiconductor mask correcting device is provided with an image acquiring unit acquiring a mask image, an extraction unit extracting only a main pattern from the mask data, an inspection unit inspecting a defective portion by comparing the extracted main pattern with a main pattern which is obtained from the mask image after a drawing by matching to each other, and a correction unit correcting the defective portion specified by the inspection unit, wherein the extraction unit includes a recognition section recognizing the main pattern and the assist pattern as a figure, a specification section specifying the assist pattern from figures which is recognized on the basis of a predetermined condition, and a main pattern extracting section extracting as the main pattern a figure other than the assist pattern.

4 Claims, 6 Drawing Sheets

SEMICONDUCTOR MASK CORRECTING DEVICE AND SEMICONDUCTOR MASK CORRECTING METHOD

This application claims priority under 35 U.S.C. §119 to Japanese Patent Application No. JP2006-128199 filed May 2, 2006, the entire content of which is hereby incorporated by reference.

BACKGROUND OF THE INVENTION

The invention relates to a semiconductor mask correcting device and a semiconductor mask correcting method of correcting a defective portion of a photo mask, which is used in the process of fabricating a semiconductor device, into a non-defective photo mask.

Since a photo mask used in the process of fabricating a semiconductor device is an original form of a pattern, an existence of a defective portion is necessarily inspected and the defective portion is appropriately corrected as needed, after a mask pattern is drawn on a mask substrate.

In a fabrication method of a usual photo mask, first, design data of the mask pattern is designed by using a computer, and then the designed data is transformed into drawing data for a drawing device. Next, a drawing of the mask pattern is performed on a mask substrate by the drawing device on the basis of the drawing data. Due to this, the photo mask a mask pattern of which is drawn on the mask substrate can be made.

Additionally, after making the photo mask, it is possible to check an existence of a defect of the photo mask or a location of the existence of that by using a defect inspecting device, and when the defect exists, a semiconductor mask correcting device performs the defect correction before transferring an image of the mask to a wafer.

As for the defects of the mask pattern, there are examples such as an extrusion which is projected as an extra protrusion from a desired pattern, and an intrusion which is a concave portion such as an empty on the desired pattern. The mask correction device specifies a location by finding the defective portions, and appropriately corrects them. In methods of the correction, for example, when the protrusion is found, the protrusion portion is corrected by a focused ion beam to be cut off (i.e. an etching process). Additionally, when the concave is found, the concave portion is corrected by gas assist method so that a predetermined material is deposited therein (i.e. a deposition process).

In addition, as for a method of inspecting the mask pattern, there are usually two ways available. That is, systems of a die to die and a die to database are available.

The die to die system is a method which is used when the same mask pattern of at least two or more is drawn on the mask substrate, and finds the defective portion from differences between the patterns by matching them to each other. The die to die system has advantages that an inspection time is short and comparatively performed in a simple way, while the system does not cope with the defective portion occurring in the same way on all patterns and the case of drawing only one pattern on the mask substrate.

Particularly, a pattern shape which is subjected to the correction becomes a fine size and a complicated shape in company with a decrease in size of a semiconductor device, recently. Therefore, it is difficult to compare the pattern shape with an original design of that. That's reason why a die to database system is required more and more instead of the die to die system.

The die to database system is a method comparing a mask image acquired by scanning a mask pattern which is actually drawn on the mask substrate with drawing data stored as CAD data, by using a pattern matching.

Using this method, an actual pattern and a designed pattern can be compared by being directly matched (piled up) to each other, and thus the defective portion such as the protrusion or the concave portion is detected in high accuracy. Thanks to this, the die to database system will be a mainstream as an inspection method from now on.

Recently, accompanied with a decrease in size of the semiconductor circuit, an optical proximity effect correction (i.e. OPC) which is one of the kinds of a resolution enhancement technology (i.e. RET) such as phase shift mask technology is just applied in the semiconductor mask fields. That is a technology using a mask for improving a transfer characteristic by controlling a phase and a transmittance of light, and OPC patterns such as a serif, a jog, and a hammer head are added on the mask pattern. In this way, even if the mask pattern is a fine pattern, it is possible to obtain a desired transfer image by using exposure.

Particularly, the transfer image transferred by the mask pattern is mostly used in a semiconductor circuit. Hence, such a method is also employed to obtain a high-accuracy semiconductor circuit.

Additionally, in addition to the OPC pattern recently, a method adding an assist pattern which is an application of the OPC pattern is contrived to expose an edge of the mask pattern more accurately (see, for example, Benjamin G. Eynon, Jr.: "Photomask Fabrication Technology", McGraw-Hill ELECTRONIC ENGINEERING, 2005, Chapter 7: Resolution Enhancement Techniques, P457-P467).

The assist pattern which is occasionally called a different name as SRAF (i.e. Sub Resolution Assist Feature) is mostly arranged to surround a vicinity of the main pattern to become a circuit pattern. The assist pattern has a characteristic that it is formed excessively thinner than the main pattern, and the pattern itself does not resolve during exposure, but when the main pattern around which the assist pattern is disposed is exposed, highly accurate transfer is enabled by solving fluctuation of the edges of the main pattern. That is, the assist pattern functions as auxiliary of the main pattern.

As mentioned above, to fabricate the fine semiconductor circuit in high accuracy, a method using a mask pattern which combines the assist pattern with the main pattern is just employed recently.

The assist pattern is disposed in accordance with a shape of the main pattern, and thus design data of the main pattern is designed first, then the assist pattern is inserted by being designed in accordance with the main pattern. Next, the pattern designs of the main pattern and the assist pattern are employed as final circuit diagram data, and then the final circuit diagram data is transformed into the mask data which is drawing data. The photo mask is fabricated by drawing on the mask substrate in accordance with the mask data.

After making the photo mask, the photo mask and the mask data is compared by the die to database system which is directly matched to each other, and the correction is appropriately performed along with the inspection of the defective portion such as the protrusion and the concave portion.

However, there are the following problems that still remain in the assist pattern mentioned above.

First, the final circuit diagram data adding the assist pattern to the main pattern transforms into the mask data which is the drawing data through a process usually called a fracturing. Because of the reason, all pattern data of the final circuit diagram data is minutely partitioned in the form of a trapezoid and a rectangle.

In particular, as shown in FIG. 9, a recent main pattern MP is formed in a complicate shape by adding the OPC pattern thereto as mentioned above. Therefore, through the fracturing process, the main pattern on data is recognized as an aggregate of a plurality of the trapezoid or the rectangular shape partitioned as shown in FIG. 10.

On the contrary, as shown in FIG. 9, the assist pattern AP is arranged around the main pattern MP in a comparatively thin and rectangular shape with a certain width, but it has a simple shape compared with the main pattern MP, and thus the assist pattern is recognized as just own shape itself as shown in FIG. 10 after the processing.

By the way, since the main pattern MP is recognized as an aggregate of shapes such as a rectangle, the main pattern can not be distinguished from the assist pattern AP on data. That is, as shown in FIG. 10, a part of figure mp forming the main pattern MP takes the same shape by comparison with the assist pattern AP, so there is a concern about an error recognizing the part of figure mp as the assist pattern AP.

Accordingly, in a step of mask data, the main pattern MP and the assist pattern AP can not be clearly recognized to be distinguished between them. Additionally, the mask data is stored into a mask data file in a partitioned state.

Accordingly, when the die to database system is attempted to inspect the photo mask after drawing on a substrate in actual situation, it is difficult to match the mask data with a photo mask image in high accuracy, and thus the inspection of the defective portion can not be performed.

Above all, since, as for the main pattern of the photo mask, the transfer image becomes semiconductor circuit when exposure is performed, it is necessary to match with the main pattern MP of the mask data in high measurement accuracy and location accuracy to inspect the defective portion, and properly correct by specifying the defective portion. However, since the main pattern MP can not be distinguished from the assist pattern AP on the mask data as mentioned above, it is not possible to inspect the main pattern which is required after the drawing.

In addition, even if it is possible to distinguish the main pattern MP of the mask data from the assist pattern AP, it is difficult to match the main pattern in high accuracy in an actual situation.

In detail, since the assist pattern AP stored as the mask data is mostly designed as a fine line shape different with the main pattern MP (to prevent resolving in the process of exposure), it is easily affected by a distortion during drawing on the mask substrate. Therefore, the assist pattern drawn in actual situation becomes distorted shape, and mostly, does not necessarily match with the assist pattern AP of the mask data. However, the assist pattern is not resolved even though the exposure is performed, so it is allowed even if there are some defective portions or errors. Accordingly, there is commonly no correction for the drawn assist pattern. That is, the correction of the photo mask is commonly performed for only the main pattern.

Because of that, when the photo mask image is matched with the mask data, it is required to inspect the defective portion by matching between locations of both main patterns only in high accuracy.

However, when the photo mask image and the mask data is subjected to the pattern matching, the high distorted assist pattern is formed on the photo mask as mentioned above, whereupon it adversely affects matching of the main pattern. For example, it is attempted to perform as the high distorted assist pattern of the photo mask is compulsory matched with the assist pattern AP of mask data, or the high distorted assist pattern of the photo mask is compulsory matched with the main pattern MP of the mask data since it is failed to correctly recognize the assist pattern.

As mentioned above, the assist pattern AP of the photo mask is one of the noise factors in the process of matching, whereupon an accuracy of matching decreases. Accordingly, the matching of the main pattern can not be performed in high accuracy, and it is not possible to exactly perform the inspection and the correction on the defective portion.

In is an object of the invention which is contrived in consideration of the situations mentioned above to provide a semiconductor mask correcting device and a semiconductor mask correcting method capable of performing the pattern matching process which matches the photo mask having the assist pattern with the mask data in high accuracy by using a die to database system, and fabricating the photo mask with high quality by performing the mask correction in high accuracy.

SUMMARY OF THE INVENTION

To solve the problems, the invention provides units which will be described below.

According to the invention, a semiconductor mask correcting device for inspecting a defective portion of a photo mask, which has a mask substrate and a mask pattern drawn on the mask substrate on the basis of mask data in which a main pattern and an assist pattern are previously stored as drawing data, and correcting the defective portion, the device includes a stage on which the photo mask is placed to be movable in parallel to the surface of the mask substrate, an image acquiring unit acquiring a mask image of the mask pattern, an extraction unit extracting only the main pattern from the mask data, an inspection unit matching and comparing the extracted main pattern with a drawn main pattern which is obtained from the mask image, along with inspecting whether the defective portion exists in the drawn main pattern in accordance with differences between both main patterns, and specifying the location of the defective portion, and a correction unit correcting the defective portion specified by the inspection unit by using a focused ion beam. In the invention, the extraction unit includes a recognition section recognizing the main pattern and the assist pattern as figures surrounded by only an outline, respectively, a specification section specifying a figure, which has a predetermined space from the nearest figure and of which at least a width and a length satisfy predetermined values, among the recognized figures as the assist pattern, and a main pattern extracting section extracting as the main pattern the figures other than the figure specified as the assist pattern.

According to the invention, a semiconductor mask correcting method of inspecting a defective portion of a photo mask, which has a mask substrate and a mask pattern drawn on the mask substrate on the basis of mask data in which a main pattern and an assist pattern are previously stored as drawing data, and correcting the defective portion, the method includes an image acquiring process of acquiring a mask image of the mask pattern drawn on the mask substrate, a recognition process of recognizing the main pattern and the assist pattern stored in the mask data as figures surrounded by only an outline, respectively, a specification process of specifying a figure, which has a predetermined space from the nearest figure and of which at least a width and a length satisfy predetermined values, among the recognized figures as the assist pattern, after the recognition process, an extraction process of extracting as the main pattern the figures other than the figure specified as the assist pattern, after the specification process, an inspection process of matching and comparing the extracted main pattern with a drawn main pattern which is obtained from the mask image, along with inspecting whether the defective portion exists in the drawn main pattern in accordance with differences between both main patterns, and specifying the location of the defective portion, and a correction process of correcting the specified defective portion by using a focused ion beam after the inspection process.

In the semiconductor mask correcting device and the method of semiconductor correction according to the invention, the photo mask on which the mask pattern including the main pattern and the assist pattern on the mask substrate is drawn is placed on the stage at the beginning. At this time, the mask pattern is drawn by a drawing device on the basis of the mask data. The mask data is exchanged for data of a drawing application by performing the fracturing process on final circuit diagram data adding the assist pattern to the main pattern. So, the pattern data stored in the mask data is stored as an aggregate of figures in a trapezoid, a rectangular shape or the like which is divided by plurality on data.

After the photo mask is placed on the stage, an image acquiring process is performed which acquires a mask image, that is, an image of the mask pattern drawn on the mask substrate by the image acquiring unit. During this time, by properly moving the stage, it is possible to scan on the mask substrate and surely acquire the mask image.

On the other hand, the extraction unit distinguishes and extracts only the main pattern from the main pattern and the assist pattern stored in the mask data.

In detail, first, the recognition section performs a recognition process which recognizes the main pattern and the assist pattern, the patterns being stored as an aggregate of figures which is divided by plurality on data, as figures surrounded by only an outline, respectively. Due to the recognition process, the main pattern stored as an aggregate of figures which is divided by plurality on data by the fracturing process becomes the condition of being reconnected to each other, thereby being recovered in the condition of final circuit diagram data which is originally designed. Specifically, even if the main pattern is designed for any complicated shape by an addition of an OPC pattern, the effect of the fracturing process is cancelled by the above-described outline and it is possible to recover as the condition of a designing step.

The assist pattern is also recovered as the state of the final circuit diagram data, but the pattern is stored in the mask data as a figure which is not affected by the fracturing process since it is originally a simple shape. Hence, the recovered figure is the same as the figure stored in the mask data.

Continuously, the specification section performs a specification process specifying a figure which is disposed in a satisfied state of a predetermined space apart from the nearest figure as the assist pattern, when at least a width and a length of each figure recognized as an independent figure by the recognition section satisfy a predetermined value. Usually, the assist pattern has a size which is not resolved during exposure and disposed on vicinity of the main pattern. Therefore, the figure satisfying aforementioned qualifications is defined as the assist pattern.

Subsequently, the main pattern extracting section specifies as the main pattern a figure other than the figure which is specified as assist pattern in the process of the specification among the figures recognized in the process of the recognition process, and performs the extraction process which extracts only the main pattern.

As mentioned above, the extraction unit can exactly extract the data of only the main pattern from the mask data which is processed by the fracturing.

The inspection unit performs matching the main pattern which is extracted in the extraction unit with a mask image which is obtained by the image acquiring process mentioned above. Specifically, the unit performs matching the extracted main pattern with a main pattern which is obtained from the mask image after a drawing. Additionally, the inspection unit performs the inspection process inspecting whether the defective portion (such as the extrusion or the intrusion) exists or not on the drawn main pattern, from the differences between both of them, in company with comparing between both patterns. Simultaneously, if the defective potion exists, the inspection unit specifies the location.

Especially, since only the main pattern is exactly extracted by distinguishing the assist pattern with the main pattern from the mask data processed by the fracturing, the assist pattern which is the known noise factor can be removed from original reference data of the die to database system. Accordingly, it is possible to match the main patterns only which should be originally corrected. As a result, it is possible to match locations of the patterns in high accuracy by using the die to database system and more accurately perform an inspecting on the defective portion and specifying locations.

Additionally, the correction unit performs the correcting process which corrects the specified defective portion by using FIB (i.e. focused ion beam). On this occasion, the existence of the defective portion is exactly inspected as mentioned above, and the position of the defective portion is exactly specified, thereby being capable of performing the mask correction in high accuracy. As the result, it is possible to fabricate the photo mask with high quality having the assist pattern. By using the photo mask fabricated as mentioned above, it is also possible to accurately fabricate a microscopic semiconductor circuit and the like where fluctuation of edges and the like is suppressed.

As mentioned above, due to the semiconductor mask correcting device and the semiconductor mask correcting method according to the invention, it is possible to perform the pattern matching process which matches the photo mask having the assist pattern with the mask data in high accuracy by using die to database system, and fabricate the photo mask with high quality by performing the mask correction in high accuracy.

Additionally, as for the semiconductor mask correcting device of the invention, in the semiconductor mask correcting device according to the invention, the correction unit corrects the defective portion by using an etching process or a formation of deposition film depending on kinds of the defective portion.

As for the semiconductor mask correcting method of the invention, in the semiconductor mask correcting method according to the invention, the step of correcting corrects the defective portion by using an etching process or a formation of deposition film depending on kinds of the defective portion.

In the semiconductor mask correcting device and the semiconductor mask correcting method according to the invention, when the correcting process is performed, the defective portion is corrected by the etching process using a FIB irradiation, in the case that the defective portion is a protrusion. Contrary, in the case that the defective portion is an intrusion, a deposition film is formed by supplying a gas which is a raw material of the deposition film and irradiating the FIB, thereby correcting the defective portion. Therefore, the correction unit can perform a reliable mask correction, since the etching process or the formation of deposition film is suitably used depending on the kinds of the defective portion.

Thanks to a semiconductor mask correcting device and a semiconductor mask correcting method according to the invention, it is possible to perform a pattern matching process which matches a photo mask having an assist pattern with mask data in high accuracy by using a die to database system, and fabricate the photo mask with high quality by performing a mask correction in high accuracy.

DETAILED DESCRIPTION OF THE PREFERRED EMBODIMENT

Hereinafter, an embodiment of a semiconductor mask correcting device and a semiconductor mask correcting method according to the invention will be described with reference to FIGS. 1 to 8.

Figure 1:
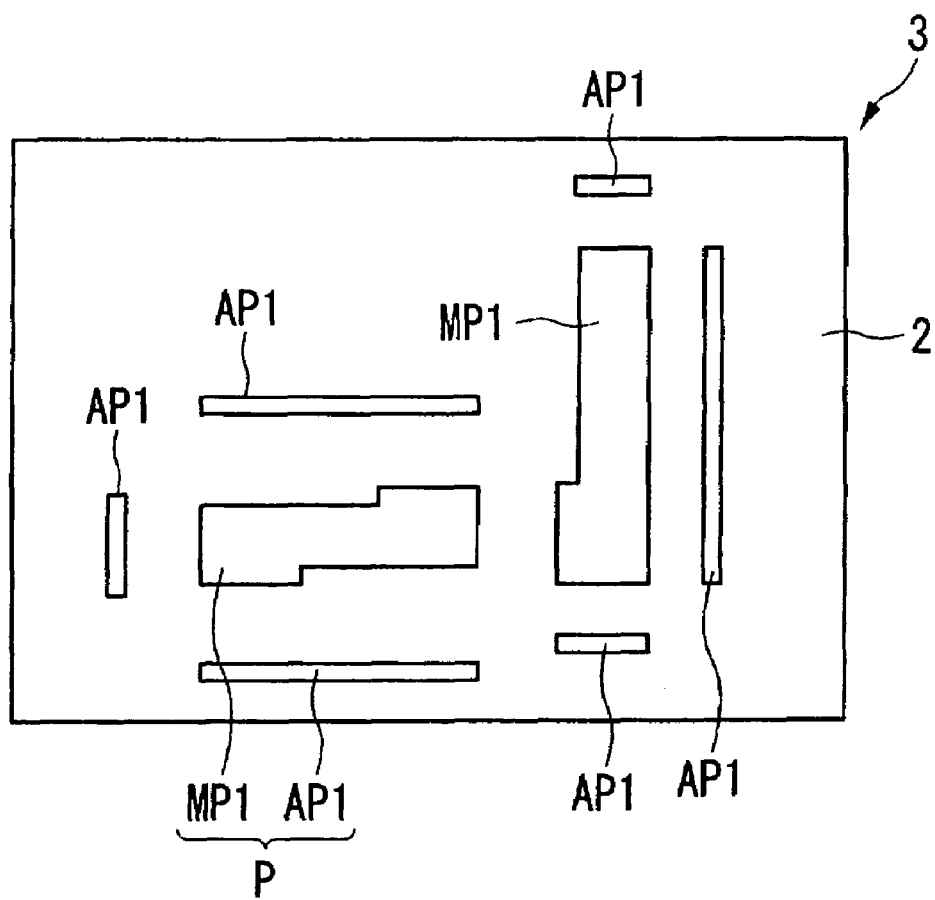
FIG. 1 is a diagram illustrating a photo mask corrected by a semiconductor mask correcting device according to the invention.

A semiconductor mask correcting device 1 of the embodiment, as shown in FIG. 1, inspects a defective portion of a photo mask 3 which has a mask substrate 2 and a mask pattern P drawn on the mask substrate 2 by a drawing device or the like, and corrects the defective portion. The mask pattern P includes the main pattern MP1 and the assist pattern AP1 which are drawn on the basis of the mask data D1 mentioned later which is previously stored as the drawing data.

Figure 2:
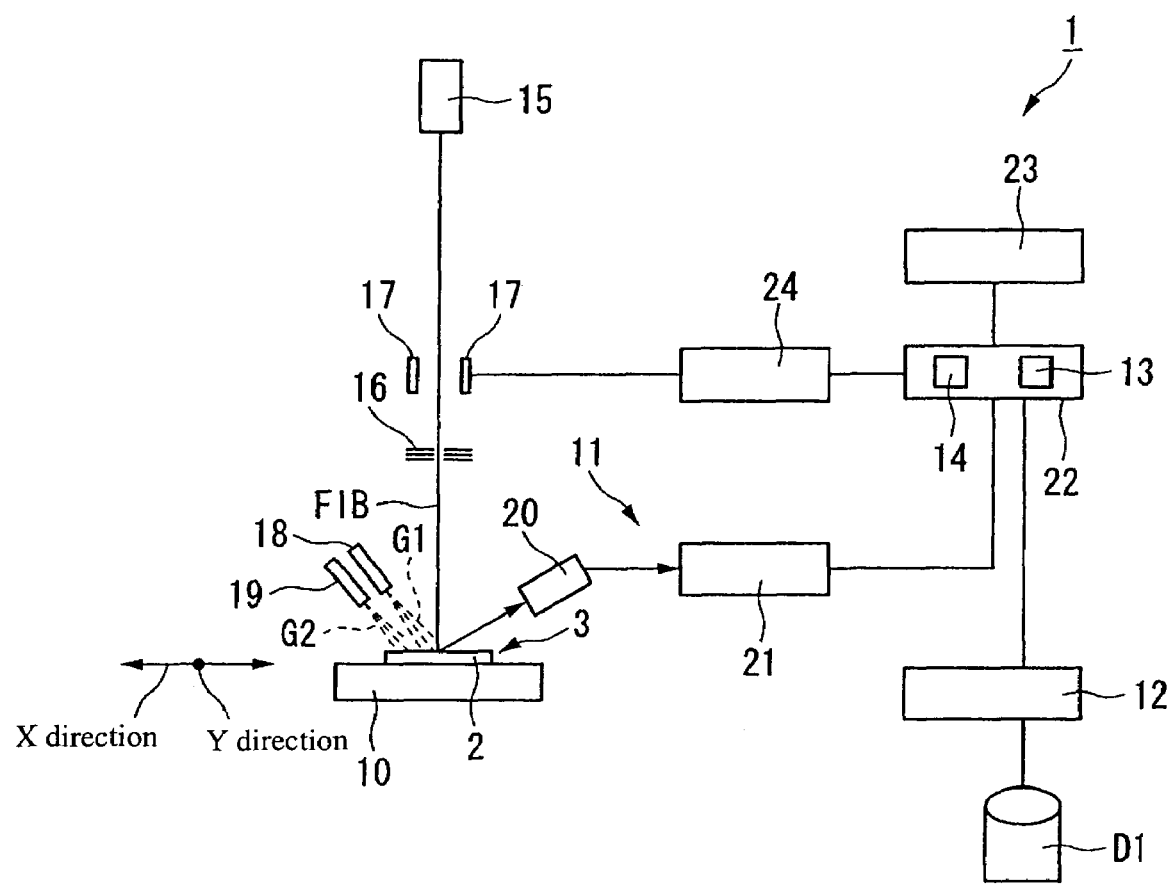
FIG. 2 is a diagram illustrating a configuration of an embodiment of the semiconductor mask correcting device according to the invention.

As shown in FIG. 2, the semiconductor mask correcting device 1 includes a XY stage 10 (stage) on which the photo mask 3 is placed to be movable in parallel direction (XY direction) to the surface of the mask substrate 2, an image acquiring unit 11 acquiring a mask image of the mask pattern P drawn on the mask substrate 2, an extraction unit 12 extracting data (Hereinafter, the data is referred to as a main pattern MP0. Likewise, data of the assist pattern AP1 is referred to as an assist pattern AP0.) of the main pattern MP1 only from pattern data stored in the mask data D1, an inspection unit 13 comparing the extracted main pattern MP0 with a main pattern MP1 which is obtained from the mask image after a drawing by matching (being piled up) to each other, and specifying the location along with inspecting whether the defective portion exists on the main pattern MP1 after the drawing in accordance with differences between both of them and specifying the location of the defective portion, and a correction unit 14 correcting the defective portion specified by the inspection unit 13 by using FIB (i.e. a focused ion beam).

As shown in FIG. 2, an upper side of the XY stage 10 includes an ionizer 15 generating ion, and an ion optical system 16 such as an object lens used in FIB by narrowly focusing the generated ion so as to form an image on the surface of the mask substrate 2. Accordingly, the FIB is set to be irradiated toward the surface of the mask substrate 2. Scan electrodes 17 including an X electrode and a Y electrode are disposed between the ionizer 15 and the ion optical system 16, and an irradiation spot of the FIB can be scanned in the predetermined range of an XY plane.

Additionally, upon the mask substrate 2, a gas gun 18 supplying gas G1 for an etching to the vicinity of the surface of the mask substrate 2 on which the FIB is irradiated, a gas gun 19 supplying raw gas (for example, phenanthrene and the like) G2 which forms a deposition film, and a secondary electron detector 20 detecting an intensity of a secondary electron which is generated by the irradiation of the FIB are disposed. A planar distribution of the secondary electron intensity corresponds to the mask pattern P which is drawn on the mask substrate 2.

The electron intensity detected by the secondary electron detector 20 is transformed into digital data by an A/D transforming circuit 21 and inputted to a PC (i.e. a personal computer) 22. Due to this, it is possible to obtain the mask image of the mask pattern P which is drawn on the mask substrate 2. Consequently, the image acquiring unit 11 includes the secondary electron detector 20, the A/D transforming circuit 21 and the PC 22.

In the PC 22, the display unit 23 displaying the acquired mask image is connected to the scan circuit unit 24 controlling the scan electrodes 17 and determining the irradiation range of the FIB, by receiving an order from the PC 22.

Figure 3:
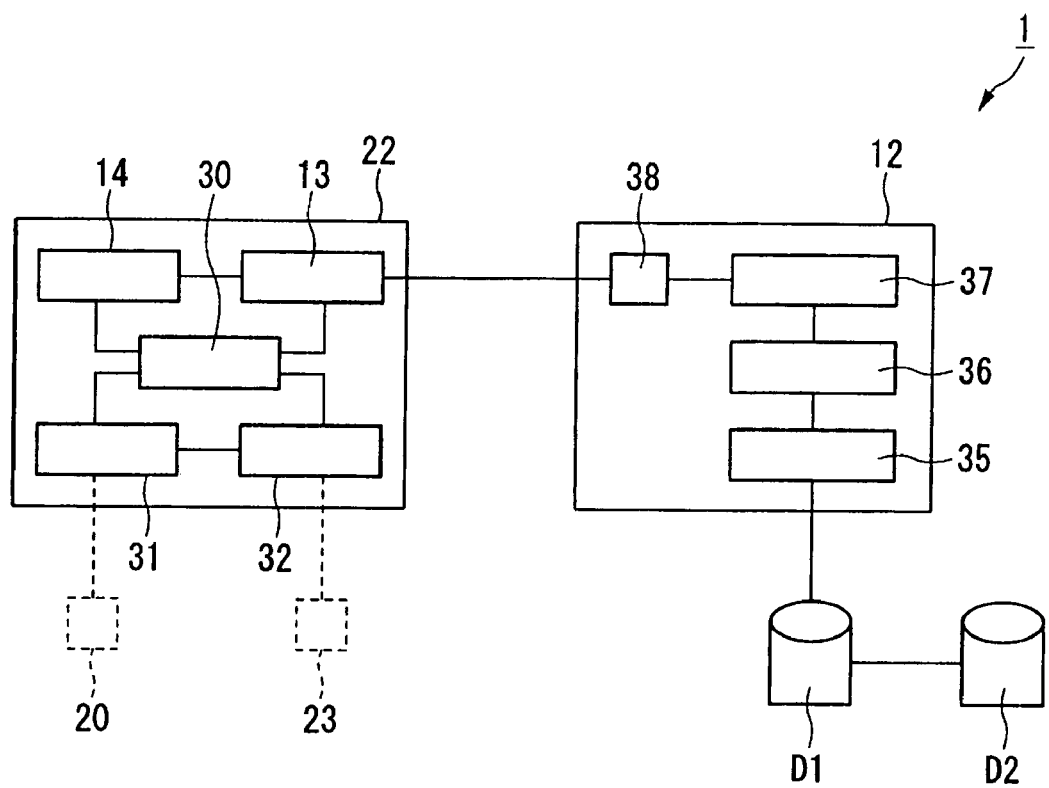
FIG. 3 is a block diagram illustrating a function of a PC and an extraction unit forming the semiconductor mask correcting device shown in FIG. 2.

As shown in the FIG. 3, the PC 22 is equipped with a control unit 30 including CPU or various kinds of memories and performing a transfer or a temporal store of data along with integrally controlling all components of the PC, an image forming unit 31 forming the mask image on the basis of the secondary electron intensity transformed into digital data by the A/D transforming circuit 21, an image output unit 32 making the mask image formed by the image forming unit 31 display on the display unit 23, and the inspection unit 13 and the correction unit 14.

The inspection unit 13 inputs the extracted main pattern MP0 from a memory 38 which is mentioned later of the extraction unit 12 in company with the main pattern MP1 after the drawing from the mask image formed by the image forming unit 31. The inspection unit 13 inspects whether the defective portion exists and notifies the correction unit 14 of the location and a kind (for example, the extrusion, the intrusion or the like) of the defective portion if the defects exist. The correction unit 14 suitably controls the scan circuit unit 24 or the gas guns 18 and 19 on the basis of information sent from the inspection unit 13, and the unit corrects the defective portion of the mask by performing the etching process or the deposition process which forms the deposition film.

The extraction unit 12 includes a recognition section 35 reading the main pattern MP0 and the assist pattern AP0 from the mask data D1 which is previously stored as the drawing data and recognizing them as figures surrounded by only an outline, respectively, a specification section 36 specifying a figure which is disposed in a satisfied state of a predetermined space S apart from the nearest figure as the assist pattern AP0 when at least a width W and a length H of recognized figures satisfy a predetermined value, a main pattern extracting section 37 extracting as the main pattern MP0 a figure other than the figure which is specified as assist pattern AP0, and the memory 38 storing the extracted main pattern MP0. Regarding to the extracting method, it will be described in detail, later.

Next, it will be described about an inspection of the photo mask 3 performed by using the semiconductor mask correcting device 1 mentioned above, and the case of the mask correction for the defective portion.

Figure 4:
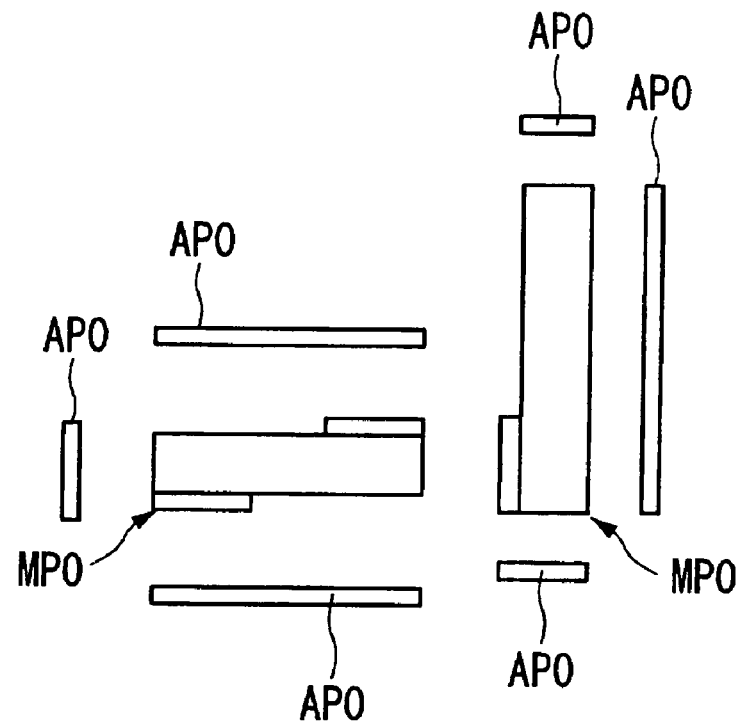
FIG. 4 is a diagram illustrating a main pattern and an assist pattern stored in mask data through a fracturing process.

As illustrated in FIG. 3, the mask data D1 is transformed for the drawing through the fracturing process from the final circuit diagram data D2 adding the assist pattern AP0 to the main pattern MP0. As a result, the pattern data of the main pattern MP0 stored in the mask data D1 is stored as an aggregate of a trapezoid shape, a rectangular shape or the like divided by a plurality of that on data, as shown in FIG. 4. However, since the assist pattern AP0 of the pattern data is formed as a simple shape, the pattern is stored in the mask data as a figure which is not affected by the fracturing process.

The correction method of the semiconductor mask in the embodiment includes an image acquiring process acquiring a mask image of the mask pattern P drawn on the mask substrate 2, a recognition process recognizing the main pattern MP0 and the assist pattern AP0 stored in the mask data D1 as figures surrounded by only an outline, respectively, a specification process specifying a figure which is disposed in a satisfied state of a predetermined space S apart from the nearest figure as the assist pattern AP0 when at least a width W and a length H of each recognized figure satisfy a predetermined value, after the recognition process, an extraction process extracting a figure other than the figure which is specified as the assist pattern AP0 as the main pattern MP0, after the specification process, an inspection process comparing the extracted main pattern MP0 with a main pattern MP1 which is obtained from the mask image after a drawing by matching to each other, and specifying the location along with inspecting whether the defective portion exists on the main pattern MP1 after the drawing in accordance with differences between both of them (MP0 and MP1), and a correction process correcting the specified defective portion by using FIB after the inspection process. Hereinafter, it will be described about these processes in detail.

First of all, the photo mask 3 is placed on the XY stage 10 as shown in FIG. 1, and the mask pattern P which is provided with the main pattern MP1 and the assist pattern AP1 on the mask substrate 2 is drawn thereon. The image acquiring process is performed which acquires a mask image, that is, an image of the mask pattern P drawn on the mask substrate 2 by the image acquiring unit 11.

Specifically, the FIB is irradiated toward the surface of the mask substrate 2 which is placed on the XY stage 10. By irradiating the FIB, the secondary electron intensity of which is corresponded to a distribution on a plane of the mask pattern P is radiated from the surface of the mask substrate 2. The secondary electron detector 20 performs an intensity detection of the radiated secondary electron. At that time, the XY stage 10 is suitably moved to scan on the mask substrate 2, and a detection of the secondary electron is performed. The detected secondary electron intensity is transformed into digital data by the A/D transforming circuit 21, and then the data is inputted to the image forming unit 31 of PC 22. The image forming unit 31 forms the mask image on the basis of the inputted secondary electron intensity. As a result, it is possible to obtain the mask image. The formed mask image is displayed on the display unit 23 by the image output unit 32 and sent to the inspection unit 13.

On the other hand, the extraction unit 12 extracts the main pattern MP0 only of the main pattern MP0 and assist pattern AP0 which is previously stored in the mask data D1 by distinguishing the assist pattern AP0 from the main pattern.

Figure 5:
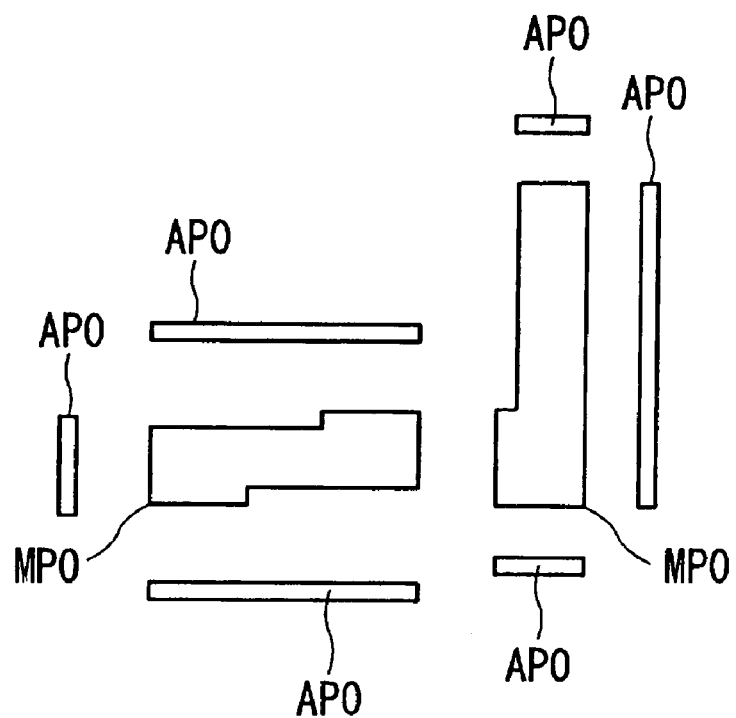
FIG. 5 is a diagram illustrating the main pattern and the assist pattern recognized as one independent figure, outlined by a recognition process of a recognition section, from the state illustrated in FIG. 4.

In detail, first, the recognition section 35 reads the data of the main pattern MP0 and assist pattern AP0 which is stored as an aggregate of figures divided by plurality on data, from the mask data D1, as shown in FIG. 4. And then, it performs a recognition process which recognizes the main pattern and the assist pattern as figures surrounded by only an outline, respectively, as shown in FIG. 5.

Due to the recognition process, the main pattern MP0 stored as an aggregate of figures which is divided by plurality on data by the fracturing process becomes the condition of being reconnected to each other, thereby being recovered in the condition of final circuit diagram data D2 which is originally designed. Specifically, even if the main pattern MP0 is designed for any complicated shape by an addition of an OPC pattern, the effect of the fracturing process is cancelled by the above-described outline and it is possible to recover as the condition of a designing step.

The assist pattern AP0 is also recovered as the state of the final circuit diagram data D2, but the pattern is stored in the mask data as a figure which is not affected by the fracturing process since it is originally a simple shape, as mentioned above. Therefore, the recovered figure is the same as the figure stored in the mask data D1.

Figure 6:
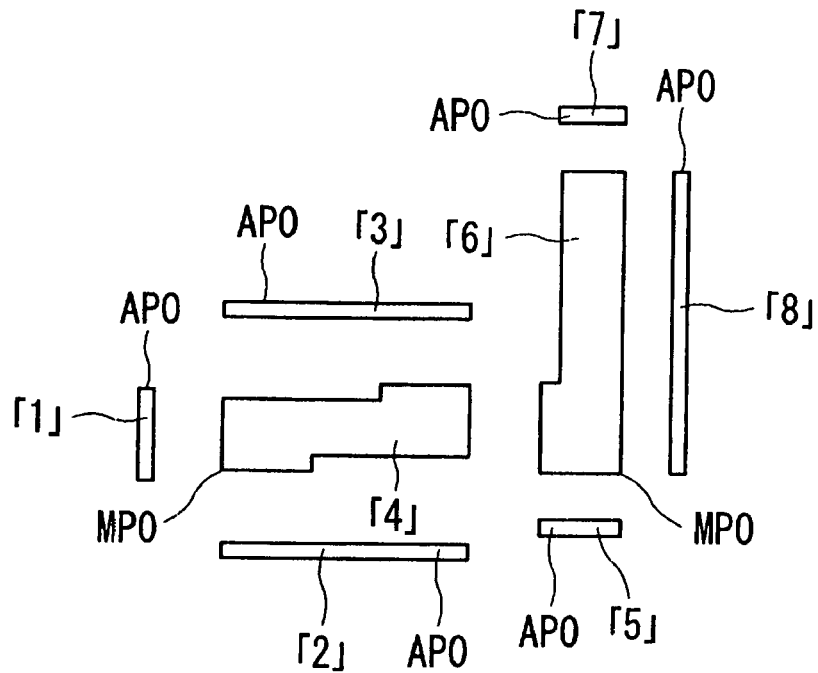
FIG. 6 is a diagram illustrating a state numbering the figures for identification, from the state illustrated in FIG. 5.

Continuously, as shown in FIG. 6, the specification section 36 numbers a figure recognized as an independent figure by the recognition section 35 for identification (FIG. 6 is illustrated by putting an identification number in brackets). Due to this, next processes can be recognized by the identification number, whereby dealing with the processes becomes easy. After the numbering, the specification section 36 performs a specification process specifying a figure which is disposed in a satisfied state of a predetermined space S apart from the nearest figure as the assist pattern AP0, when at least a width W and a length H of figures satisfy a predetermined value. Usually, the assist pattern AP0 has a size which is not resolved during the exposure and disposed on the vicinity of the main pattern MP0. Therefore, the figure satisfying aforementioned qualifications is defined as the assist pattern AP0.

Figure 7:
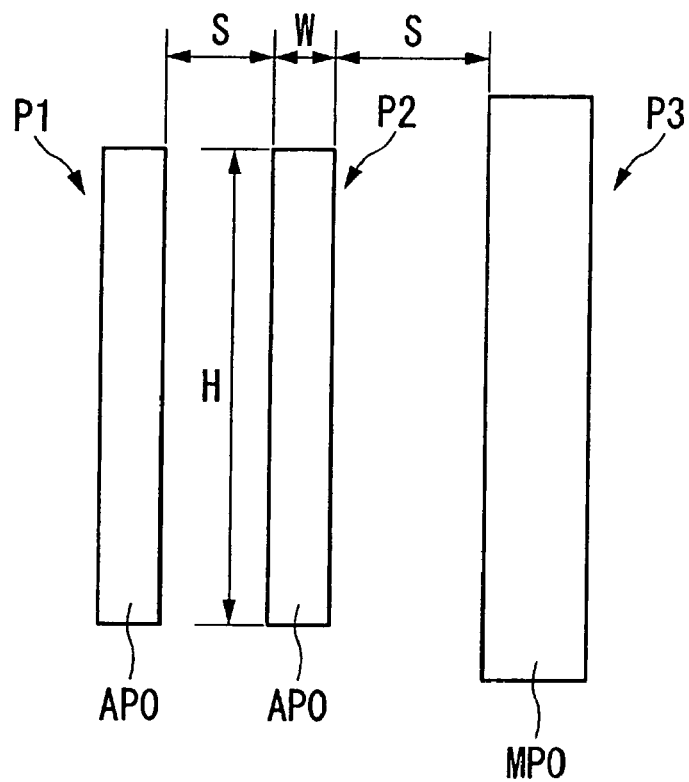
FIG. 7 is a diagram using for a description of a definition for specifying the assist pattern, and illustrating a state where both assist pattern and main pattern are arranged.

For example, in FIG. 7, when a rectangular pattern is sequentially defined as P1, P2 and P3 from the left of the paper, the figure P2 satisfying the condition that the width W of the rectangular pattern figure P2 is in the predetermined range of the minimum width $W_{Min}$ to the maximum width $W_{Max}$, the length H of the figure P2 is not less than the predetermined minimum length $H_{Min}$, and the space S which is narrow one of spaces between the figure P2 and the nearest one of a figure P1 or P3 when seen in perpendicular to the longitudinal direction of the figure P2 is in the range of the minimum space $S_{Min}$ to the maximum space $S_{max}$ is specified as the assist pattern AP0. Since there is used the space S from the nearest figure as a judge condition, the assist pattern AP0 can be exactly specified in either case that another figure exists only one side or both.

As a result, two figures P1 and P2 are specified as the assist pattern AP0 in the case illustrated in FIG. 7.

On the basis of the definitions, the specification section 36 specifies totally 6 figures the identification number of which is "1" to "3", "5", "7" and "8" among figures illustrated in FIG. 6 as the assist pattern AP0.

Figure 8:
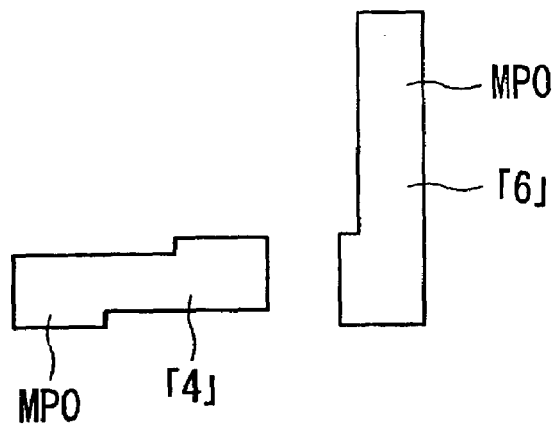
FIG. 8 is a diagram illustrating a state after extracting only the main pattern other than the assist pattern, from the state illustrated in FIG. 6.
Figure 9:
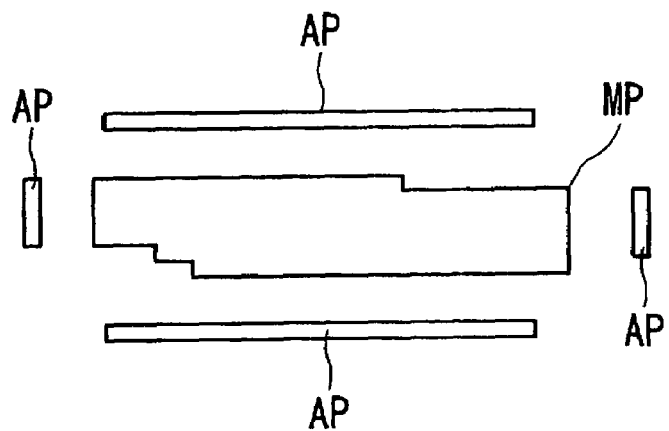
FIG. 9 is a diagram illustrating the known die to database system and a main pattern and an assist pattern designed in the step of final circuit diagram data.
Figure 10:
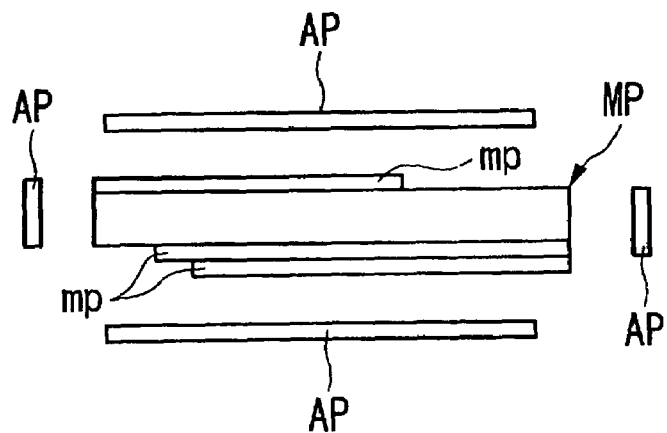
FIG. 10 is a diagram illustrating the main pattern and the assist pattern transformed into mask data through a fracturing process, from the state illustrated in FIG. 9.

Subsequently, the main pattern extracting section 37 specifies, as the main pattern MP0, a figure other than the figures (totally 6 figures as mentioned above) which is specified as the assist pattern AP0 in the specification section 36 among totally 8 figures recognized during the recognition process. The main pattern extracting section also performs the extraction process extracting the main pattern MP0 only. Consequently, as shown in FIG. 8, figures of the identification number "4" and "6" are extracted as the main pattern MP0.

As mentioned above, the extraction unit 12 performs the recognition process, the specification process and the extraction process, whereby only the main pattern MP0 can accurately extract from the mask data D1 processed by the fracturing. The extracted main pattern MP0 is stored in the memory 38.

The inspection unit 13 performs reading the main pattern MP0 which is extracted in the extraction unit 12 from the memory 38, and then matching the main pattern MP0 with the mask image which is sent from the image forming unit 31. Specifically, the unit performs matching the extracted main pattern MP0 with a main pattern MP1 which is obtained from the mask image after the drawing. Additionally, the inspection unit 13 performs the inspection process inspecting whether the defective portion exists on the main pattern MP1 after the drawing, from the differences between both of them, in company with comparing between both patterns. As a result, if the defective potion exists, the inspection unit specifies the kinds (such as the extrusion or the intrusion) and the location of the defective portion.

Particularly, due to the definition added to the assist pattern by the outlining and the predetermined condition, the assist pattern AP0 and the main pattern MP0 are clearly distinguished from each other in the mask data D1 processed by the fracturing, and only the main pattern MP0 is accurately extracted. Accordingly, it is possible to remove the assist pattern AP0 which is the known noise factor from the original reference data in the die to database system. Hence, only the main patterns which are original targets of the correction can be subjected to the matching process. As the result, it is possible to match the location in high accuracy by using the die to database system and accurately perform the inspection and the location specification of the defective portion.

Additionally, the correction unit 14 is suitably controls the scan circuit unit 24 or the gas guns 18 and 19 on the basis of information sent from the inspection unit 13, and the correction unit performs the correction process correcting the defective portion of the mask by performing the etching process or the deposition process which forms the deposition film. To clarify, when the defective portion is the extrusion, the FIB is irradiated while supplying the gas G1 for the etching from the gas gun 18. Using this method, the correction can be performed on the defective portion by the etching process. Conversely, when the defective portion is the intrusion, the FIB is irradiated while supplying the raw gas G2 from the gas gun 19. Using this method, the correction can be performed on the defective portion by the deposition process forming the deposition film in the intrusion portion. Therefore, the correction unit 14 performs the accurate mask correction since the correction is performed by selectively using the etching process or the deposition process in accordance with the kinds of the defective portion.

When the correction is performed, the existence of the defective portion is accurately inspected as mentioned above, and the location of the defective portion is accurately specified, and thus the high accurate mask correction can be performed. Accordingly, the photo mask 3 with high quality which has the assist pattern AP1 can be fabricated. Using the photo mask 3 fabricated as mentioned above, it is possible to accurately fabricate the microscopic semiconductor circuit where the fluctuation of edges and the like is suppressed.

In the semiconductor mask correcting device 1 and the method using the same of the embodiments mentioned above, the photo mask 3 having the assist pattern AP1 can be matched with the mask data D1 by the pattern matching in high accuracy, using the die to database system and it is possible to fabricate the photo mask 3 with high quality by performing the accurate mask thereon.

Technology range of the invention is not limited to the embodiment mentioned above, and may be modified to various forms of the embodiment in the range of the object of the invention, if necessary.

For example, to extract the main pattern from the pattern data which is stored in the mask data, first, the assist pattern is specified. At that time, even adding more minute conditions to a width, a length, and a space from an adjacent figure of the figure, it does not matter that the definition added to the assist pattern is performed. Adding more minute conditions, the pattern design is more complicated, but it is still possible to perform the extraction of the main pattern by clearly specifying the assist pattern. However, since the extraction process speed decreases depending on the added conditions, it is better for efficiency to specify the assist pattern in the condition of at least a width, a length, and a space as mentioned above.

What is claimed is:

1. A semiconductor mask correcting device for inspecting a defective portion of a photo mask, which has a mask substrate and a mask pattern drawn on the mask substrate on the basis of mask data in which a main pattern and an assist pattern are previously stored as drawing data, and correcting the defective portion, the device comprising:
   a stage on which the photo mask is placed to be movable in parallel to the surface of the mask substrate;
   an image acquiring unit acquiring a mask image of the mask pattern;
   an extraction unit extracting only the main pattern from the mask data;
   an inspection unit matching and comparing the extracted main pattern with a drawn main pattern which is obtained from the mask image, along with inspecting whether the defective portion exists in the drawn main pattern in accordance with differences between both main patterns, and specifying the location of the defective portion; and
   a correction unit correcting the defective portion specified by the inspection unit by using a focused ion beam,
   wherein the extraction unit includes
      a recognition section recognizing the main pattern and the assist pattern as figures surrounded by only an outline, respectively,
      a specification section specifying a figure, which has a predetermined space from the nearest figure and of which at least a width and a length satisfy predetermined values, among the recognized figures as the assist pattern, and
      a main pattern extracting section extracting as the main pattern the figures other than the figure specified as the assist pattern.

2. The semiconductor mask correcting device according to claim 1, wherein the correction unit corrects the defective portion by using an etching process or a formation of deposition film depending on kinds of the defective portion.

3. A semiconductor mask correcting method of a defective portion of a photo mask, which has a mask substrate and a mask pattern drawn on the mask substrate on the basis of mask data in which a main pattern and an assist pattern are previously stored as drawing data, and correcting the defective portion, the method comprising:

an image acquiring process of acquiring a mask image of the mask pattern drawn on the mask substrate;

a recognition process of recognizing the main pattern and the assist pattern stored in the mask data as figures surrounded by only an outline, respectively;

a specification process of specifying a figure, which has a predetermined space from the nearest figure and of which at least a width and a length satisfy predetermined values, among the recognized figures as the assist pattern, after the recognition process;

an extraction process of extracting as the main pattern the figures other than the figure specified as the assist pattern, after the specification process;

an inspection process of matching and comparing the extracted main pattern with a drawn main pattern which is obtained from the mask image, along with inspecting whether the defective portion exists in the drawn main pattern in accordance with differences between both main patterns, and specifying the location of the defective portion; and a correction process of correcting the specified defective portion by using a focused ion beam after the inspection process.

4. The semiconductor mask correcting method according to claim 3, wherein the correction process corrects the defective portion by using an etching process or a process of forming a deposition film depending on kinds of the defective portion.

* * * * *